US011236417B2

(12) United States Patent
Hartmann et al.

(10) Patent No.: US 11,236,417 B2
(45) Date of Patent: Feb. 1, 2022

(54) METHOD FOR PRODUCING GE-CORE BASED WAVEGUIDES

(71) Applicant: COMMISSARIAT A L'ENERGIE ATOMIQUE ET AUX ENERGIES ALTERNATIVES, Paris (FR)

(72) Inventors: Jean-Michel Hartmann, Montbonnot-Saint-Martin (FR); Mickael Brun, Eybens (FR); Jean-Marc Fedeli, Saint-Egreve (FR); Maryse Fournier, St Martin d'Uriage (FR)

(73) Assignee: COMMISSARIAT A L'ENERGIE ATOMIQUE ET AUX ENERGIES ALTERNATIVES, Paris (FR)

( * ) Notice: Subject to any disclaimer, the term of this patent is extended or adjusted under 35 U.S.C. 154(b) by 84 days.

(21) Appl. No.: 16/213,402

(22) Filed: Dec. 7, 2018

(65) Prior Publication Data

US 2019/0177836 A1 Jun. 13, 2019

(30) Foreign Application Priority Data

Dec. 8, 2017 (FR) ..................... 17 61862

(51) Int. Cl.
*C23C 16/24* (2006.01)
*C30B 25/02* (2006.01)
(Continued)

(52) U.S. Cl.
CPC ............. *C23C 16/06* (2013.01); *C23C 16/24* (2013.01); *C23C 16/56* (2013.01); *C30B 25/02* (2013.01);
(Continued)

(58) Field of Classification Search
CPC ........ C30B 25/02; G02B 6/102; C23C 16/24; C23C 16/06; C23C 16/56
(Continued)

(56) References Cited

U.S. PATENT DOCUMENTS 7,037,856 B1 5/2006 Maa et al.
2002/0174826 A1* 11/2002 Maydan ................. G02B 6/132
117/84

(Continued)

FOREIGN PATENT DOCUMENTS

FR 3 028 094 5/2016

OTHER PUBLICATIONS

Hartmann et al; Impact of the H2 anneal on the structural and optical properties of thin and thick Ge layers on Si; Low temperature surface passivation of Ge by Si; Journal of Crystal Growth; 312; pp. 532-541 (Year: 2010).*
(Continued)

*Primary Examiner* — Elizabeth A Burkhart
(74) *Attorney, Agent, or Firm* — Oblon, McClelland, Maier & Neustadt, L.L.P.

(57) ABSTRACT

A method for producing a waveguide including a germanium-based core and a cladding is provided, the method including a step of "low temperature" depositing of a shell after forming the core by engraving, such that the deposition temperature is less than 780° C., followed by a step of "high temperature" depositing of a thick encapsulation layer. The shell and the encapsulation layer at least partially form the cladding of the waveguide. Optionally, a step of annealing under hydrogen at a "low temperature", less than 750° C., precedes the deposition of the shell. These "low temperature" annealing and depositing steps advantageously make it possible to avoid a post-engraving alteration of the free surfaces of the core during the forming of the cladding which is less germanium-rich.

24 Claims, 4 Drawing Sheets

(51) Int. Cl.
G02B 6/10 (2006.01)
C23C 16/06 (2006.01)
G02B 6/13 (2006.01)
C23C 16/56 (2006.01)
H01L 21/02 (2006.01)
G02B 6/12 (2006.01)

(52) U.S. Cl.
CPC ............. *G02B 6/102* (2013.01); *G02B 6/131* (2013.01); *G02B 2006/12061* (2013.01); *H01L 21/0245* (2013.01); *H01L 21/0262* (2013.01); *H01L 21/02532* (2013.01)

(58) Field of Classification Search
USPC ...................................................... 427/163.2
See application file for complete search history.

(56) References Cited

U.S. PATENT DOCUMENTS

| | | | | |
|---|---|---|---|---|
| 2008/0253728 | A1* | 10/2008 | Sparacin | G02B 6/132 385/132 |
| 2010/0260462 | A1* | 10/2010 | Zhang | G02B 6/1223 385/131 |
| 2011/0044362 | A1* | 2/2011 | Wada | H01S 5/1071 372/45.01 |
| 2016/0126095 | A1 | 5/2016 | Bogumilowicz et al. | |

OTHER PUBLICATIONS

French Preliminary Search Report dated Aug. 14, 2018 in French Application 17 61862, filed on Dec. 8, 2017 (with English Translation of Categories of Cited Documents & Written Opinion).

Brun, M., et al. "Low loss SiGe graded index waveguides for mid-IR applications", Optics Express vol. 22, No. 1, 2014, 11 pages.

Barritault, P., et al. "Design, fabrication and characterization of an AWG at 4.5 μm", Optics Express vol. 23, No. 20, 2015, 14 pages.

Ettabib, M., et al. "Polarization Insensitive Wavelength Conversion in a Low-Birefringence SiGe Waveguide", IEEE Photonics Technology Letters vol. 28 No. 11, 2016, 4 pages.

Chang, Y., et al. "Low-loss germanium strip waveguides on silicon for the mid-infrared", Optics Letters vol. 37, No. 14, 2012, 3 pages.

Bogumilowicz, Y., et al. "SiGe high-temperature growth kinetics in reduced pressure-chemical vapor deposition" Journal of Crystal Growth 274, 28, 2005, 10 pages.

Bogumilowicz, Y., et al. "High germanium content SiGe virtual substrates grown at high temperatures", Journal of Crystal Growth 283, 346, 2005, 10 pages.

Hartmann, J., et al. "Investigation of the Low Temperature / High Temperature Approach to Produce $Si_{0.5}Ge_{0.5}$ and Pure Ge Strain Relaxed Buffers", ECS Transactions 75 (8), 579, 2016, Abstract Only—1 page.

Abbadie, A., et al. "Low thermal budget surface preparation of Si and SiGe", Applied Surface Science 225, 2004, 11 pages.

Hartmann, J., et al. "Epitaxial growth of Ge thick layers on nominal and 6° off Si(0 0 1); Ge surface passivation by Si", Semiconductor Science and Technology 24, 055002, 2009, 11 pages.

Hartmann, J., et al. "Impact of the $H_2$ anneal on the structural and optical properties of thin and thick Ge layers on Si; Low temperature surface passivation of Ge by Si", Journal of Crystal Growth 312, 2010, 10 pages.

Hartmann, J., et al. "Reduced pressure-chemical vapor deposition of Ge thick layers on Si(001) for 1.3-1.55-μm photodetection", Journal of Applied Physics vol. 95, No. 10, 2004, 9 pages.

Gonzatti, F., et al. "Low and High Temperature Boron and Phosphorus Doping of Si for Junctions and MEMS purposes", ECS Transactions 16 (10), 2008, 9 pages.

Bellegarde, C., et al. "Improvement of Sidewall Roughness of Sub-Micron Silicon-on-Insulator Waveguides for Low-Loss On-Chip Links", Proceedings of the SPIE Photonics West Conference, vol. 10108, 2017, 14 pages.

Hartmann, J., et al. "A benchmarking of silane, disilane and dichlorosilane for the low temperature growth of group IV layers", Thin Solid Films 520, 2012, 5 pages.

Py, M., et al. "Characterization and modeling of structural properties of SiGe/Si superlattices upon annealing", Journal of Applied Physics 110, 044510, 2011, 13 pages.

Samoilov, A., et al. "Increase Optical Bandwidth with Epi CVD", Optoelectronics, Electronic Packaging and Production, vol. 42, No. 11, 2002, 4 pages.

Grillet, C., et al. "Low loss SiGe waveguides in the MID-IR", 2013 Conference on Lasers & Electro-Optics Europe & International Quantum Electronics Conference CLEO Europe/IQEC, 2013, 1 page.

\* cited by examiner

METHOD FOR PRODUCING GE-CORE BASED WAVEGUIDES

TECHNICAL FIELD OF THE INVENTION

The invention relates to the field of optical waveguides. It has a particularly advantageous application in producing waveguides suitable for the infrared medium spectrum.

STATE OF THE ART

In the field of optical waveguides configured to confine and propagate a light flux having a wavelength belonging to the infrared medium (IRM) spectrum, a technology generally consists of producing a waveguide comprising a core and a cladding surrounding the core, the core and the cladding having a sufficiently high optical index contrast to confine the light flux in the core of the waveguide.

In particular, for light flux wavelengths of between 3 µm and 8 µm ($10^{-6}$ meters), such an IRM waveguide by index contrast can comprise a silicon-germanium (SiGe) core with a germanium concentration of a few tens of atomic percent, and a silicon (Si) cladding.

For light flux wavelengths of between 8 µm and 15 µm, such an IRM waveguide by index contrast can comprise a germanium (Ge) core, and a silicon-germanium (SiGe) cladding with a germanium concentration of a few tens of atomic percent.

The core of these IRM waveguides generally have substantially rectangular cross-sections having height and width dimensions of a few micrometers, said cross-sections being taken perpendicularly to the main direction of propagation of the corresponding light fluxes.

The claddings of these IRM waveguides also have thicknesses of a few micrometers, so as to confine the light fluxes having wavelengths of a few micrometers.

The production methods used to produce these IRM waveguides generally comprise a step of depositing a first very thick germanium-based layer (typically 3 to 6 µm) on a substrate prepared beforehand, a step of forming the core by lithography and engraving this first layer, and a step of depositing a second very thick layer (typically 6 to 12 µm) so as to form the cladding of the waveguide by encapsulating or claddinging the core.

FIGS. 1 and 2 schematically illustrate and by scanning electron microscope, a waveguide undergoing production, after formation of the core.

Through experiments, it has been shown that such a waveguide has, after encapsulation of the core, good performances for the confining and the propagation of an IRM light flux.

A challenge is to produce such waveguides with an industrial yield.

However, in the scope of development of the present invention, it has been proven that the production methods usually implemented in an industrial production context lead to waveguides of which the performances are degraded.

Therefore, there is a need consisting of proposing a solution to industrially produce this type of waveguide, this without altering the performances thereof.

An aim of the present invention is to meet this need.

The other aims, characteristics and advantages of the present invention will appear upon examining the following description and supporting drawings. It understood that other advantages can be incorporated.

SUMMARY OF THE INVENTION

To achieve this aim, the present invention provides, according to a first aspect, a method for producing a waveguide comprising at least one core and one cladding, the method comprising at least the following steps:

Providing a substrate,

Depositing a germanium (Ge)-based layer on the substrate,

Forming the core of the waveguide in said Ge-based layer,

Depositing an encapsulation layer around the core, the encapsulation layer having a zero germanium content $t_{Ge\ encapsulation}$ or such that:

$$t_{Ge\ encapsulation} \leq 0.9 t_{Ge\ core},$$

$t_{Ge\ core}$ being the germanium content of the core, so as to at least partially form the cladding, Advantageously, the method further comprises, before the step of depositing the encapsulation layer, at least the following step:

Depositing, by epitaxy, a shell around the core, said shell at least partially forming said cladding and having a zero germanium content $t_{Ge\ shell}$ or such that:

$$t_{Ge\ shell} \leq 0.9 t_{Ge\ core},$$

the deposition by epitaxy of the shell being done at a temperature:

$$T_{shell\ epitaxy} \leq 780°\ C.$$

Moreover, said encapsulation layer is advantageously deposited by epitaxy at a temperature $T_{encapsulation\ epitaxy}$ such that:

$$T_{encapsulation\ epitaxy} \geq 1.08 * T_{shell\ epitaxy}.$$

The method proposed by the present invention provides numerous advantages which will be detailed below.

Usually, the conventional industrial production methods use increased depositing temperatures to deposit or make grow Si- or SiGe-based very thick layers. These high-temperature deposits make it possible to obtain increased growth speeds for these layers (typically greater than 100 nm·min$^{-1}$). These increased growth speeds make it possible to limit a plate treatment time and contribute to obtaining industrial yields for these conventional industrial production methods.

In particular, during the formation of the cladding by encapsulating the core, the deposition temperatures of the second layer termed encapsulation layer are usually greater than or equal to 850° C.

However, in the scope of the development of the present invention, it has been observed that the core was substantially altered after encapsulation by these conventional industrial production methods.

In particular, this alteration is conveyed by a deformation of the free surfaces of the core. The appearance of faces at the upper corners of the core can, for example, be observed. The cross-section of the core is subsequently no longer rectangular.

In certain cases observed during the development of the present invention, this alteration is conveyed also by a partial recess of the core of the waveguide.

These alterations appear in FIGS. 3a and 3b.

The present invention aims for a method for producing an IRM waveguide which is compatible with industrial yields and in particular preserve the integrity of the core.

For this, after formation of the core, the method according to the invention comprises a step of depositing a shell, significantly less germanium-rich than the core, and deposited at a "low temperature".

This low-temperature depositing avoids an increase that is too high in the mobility of atoms of the core at the level of the free surfaces. Yet, in the scope of the development of the present invention, it has been identified that the alteration of the core at least partially comes from this mobility that is too high of the atoms. This low-temperature depositing thus makes it possible to preserve a rectangular cross-section, for example, of the core of the waveguide. It avoids the appearance of faces and the alteration of the free surfaces linked to a redistribution of material of the core.

To increase the deposition speed of the cladding material around the core, so as to make the method compatible with an industrial production, the deposition of the "low-temperature" shell is followed by a "high-temperature" depositing of the encapsulation layer, at a temperature $T_{encapsulation\ epitaxy}$ significantly higher than the deposition temperature of the shell $T_{shell\ epitaxy}$.

For example, the deposition by epitaxy temperature of the encapsulation layer $T_{encapsulation\ epitaxy}$ is greater than or equal to 830° C. and preferably greater than or equal to 850° C., so as to benefit from increase depositing speeds.

The shell, being less germanium-rich than the core, is more robust than the core vis-à-vis this "high-temperature" depositing. The core is thus protected by the shell during the formation of the very thick cladding.

Subsequently, the cladding partially comprises the shell and the encapsulation layer.

According to an advantageous possibility, the germanium content of the encapsulation layer is less than or equal to the germanium content of the shell, this in order to improve the confining of the optical mode in the waveguide.

Moreover, these germanium contents are preferably less than 80% of the germanium content of the core, and preferably less than 50% of the germanium content of the core, so as to obtain a good optical index contrast between the core and the cladding of the waveguide.

An aspect of the invention relates to a use of a waveguide wherein the germanium (Ge)-based layer is a silicon-germanium (SiGe) layer, said waveguide being used to propagate a light flux of which the wavelength is between 2 µm and 9 µm and preferably between 3 µm and 8 µm.

This aspect further relates to a use of a waveguide wherein the germanium (Ge)-based layer is a germanium (Ge) layer, said waveguide being used to propagate a light flux of which the wavelength is between 7 µm and 16 µm and preferably between 8 µm and 15 µm.

An aspect of the invention relates to a waveguide comprising a core and a cladding wherein the core is made of a germanium (Ge)-based material and the cladding is made of a silicon (Si)-based material. Advantageously, the cladding comprises a shell at least partially surrounding the core and an encapsulation layer at least partially surrounding the shell, said shell having a Ge content $t_{Ge\ shell}$ and a thickness $e_{shell}$, and said encapsulation layer having a Ge content $t_{Ge\ encapsulation}$ and a thickness $e_{encapsulation}$ such that:

$$t_{Ge\ shell} \approx t_{Ge\ encapsulation} \text{ and } e_{shell} \leq 0.1 * e_{encapsulation},$$

preferably $e_{shell} \leq 0.05 * e_{encapsulation}$.

BRIEF DESCRIPTION OF THE FIGURES

The aims, objectives, as well as the characteristics and advantages of the invention will emerge better from the detailed description of embodiments of the latter which are illustrated by the following supporting drawings, wherein.

Figure 1:
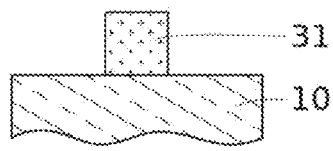
FIG. 1 shows a cross-section of a waveguide undergoing production according to a production method of the prior art.
Figure 2:
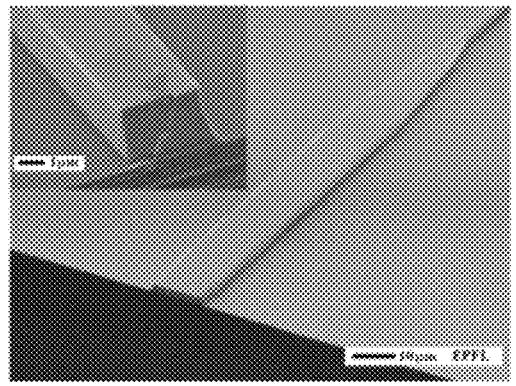
FIG. 2 shows a scanning electron microscope image of a waveguide undergoing production according to a production method of the prior art.
Figure 3A:
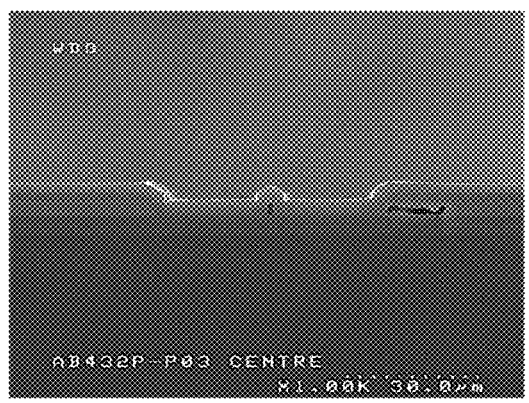
FIG. 3a shows a first scanning electron microscope image of a waveguide having structural defects and produced according to a production method of the prior art.
Figure 3B:
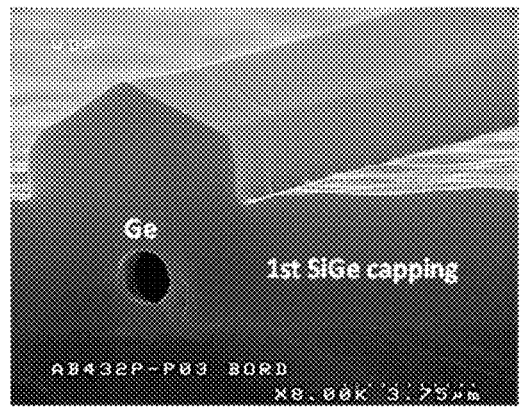
FIG. 3b shows a second scanning electron microscope image—at a greater magnification than that of the first image in FIG. 3a—of a waveguide having structural defects and produced according to a production method of the prior art.

The drawings are given as examples and are not limiting of the invention. They constitute schematic principle representations intended to facilitate the understanding of the invention and are not necessarily to scale of practical applications. In particular, the relative thicknesses of the different layers and films are not representative of reality.

DETAILED DESCRIPTION OF THE INVENTION

Before starting a detailed review of the embodiments of the invention, optional characteristics are stated below which can possibly be used in association or alternatively: According to a particularly advantageous embodiment for producing waveguides optimized for light fluxes having wavelengths of between 3 µm and 8 µm (3-8 µm IRM band), the method can comprise the optional characteristics which can possibly be used in association or alternatively:

- the Ge-based layer is a silicon-germanium (SiGe) layer.
- the Ge-based layer has a thickness $e_{core}$ of between 1 and 4 µm, the thickness $e_{core}$ being determined along a direction perpendicular to the main plane wherein the substrate extends.
- the Ge-based layer has a substantially constant germanium content along the thickness $e_{core}$ and is between 20% and 50%.
- alternatively to the preceding characteristic, the Ge-based layer has a varying germanium content along a direction perpendicular to the main plane wherein the substrate extends, according to a concentration profile, said concentration profile having a maximum of between 30% and 50%, and a minimum of between 0% and 5%. The concentration profile can be, for example, triangular.
- the encapsulation layer and the shell are made of silicon (Si).

$T_{shell\ epitaxy} \leq 750°$ C.

$T_{encapsulation\ epitaxy} \leq 1000°$ C.

preferably, the two preceding characteristics are combined: $T_{shell\ epitaxy} \leq 750°$ C. and $T_{encapsulation\ epitaxy}$ 1000° C.

These depositing temperatures relating to a shell and an Si encapsulation layer contribute to avoiding the faceting of the free surfaces of the SiGe core and to limiting the redistribution of material during the formation of the cladding.

the deposition by epitaxy of the shell is based on a chemistry with a basis of a gaseous precursor $Si_nH_{2n+2}$, n being a whole number, or $SiH_2Cl_2$.

A chemistry $SiH_4$ makes it possible, in particular, to obtain increased growth speeds of a relatively low epitaxy temperature. Such a chemistry therefore makes it possible to improve a yield of the methods for producing waveguides. A chlorinated chemistry $SiH_2Cl_2$, possibly with the addition of HCl, makes it possible to avoid a too-high soiling of the walls of a depositing chamber by epitaxy during very thick deposits.

the deposition by epitaxy of the shell is done at a pressure of between 10 Torr and 100 Torr, and preferably substantially equal to 20 Torr.

Such a pressure during the deposition makes it possible to avoid a possible nucleation in a gaseous phase generating crystalline defects in the deposited layers.

the Si shell has a thickness $e_{shell}$ of between 50 nm and 100 nm, the thickness $e_{shell}$ being determined at the right of the core and along a direction perpendicular to the main plane wherein the substrate extends.

This Si shell thickness range offers a sufficient protection of the SiGe core, while avoiding having a depositing step that is too long.

According to an embodiment, alternative to the preceding embodiment, and particularly advantageous for producing waveguides optimized for light fluxes having wavelengths of between 8 μm and 15 μm (8-15 μm IRM band), the method can comprise the optional characteristics which can possibly be used in association or alternatively:

the germanium-based layer has a germanium content strictly greater than 50%. This layer can be a silicon-germanium layer or a germanium layer and preferably has a germanium content of greater than 95%.

the method further comprises, before the step of depositing the Ge-based layer, at least the following step:

Depositing at least one silicon-germanium buffer layer having a germanium content of between 20% and 40%.

The encapsulation layer and the shell are made of silicon-germanium (SiGe), the germanium contents in said shell and said encapsulation layer being of between 20% and 40%.

$T_{shell\ epitaxy} \leq 650°$ C. and $T_{encapsulation\ epitaxy} \leq 850°$ C.

These depositing temperatures relating to a shell and a SiGe encapsulation layer contribute to avoiding the faceting of the free surfaces of the Ge core and to limiting the redistribution of material during the formation of the cladding.

The deposition by epitaxy of the shell is based on a chemistry with a basis of gaseous precursors $Si_nH_{2n+2}+Ge_mH_{2m+2}$ n and m being whole numbers, or $SiH_2Cl_2+GeH_4$.

The shell has a thickness $e_{shell}$ of between 100 nm and 500 nm.

This SiGe shell thickness range offers a sufficient protection of the Ge core while avoiding having a depositing step that is too long.

According to an advantageous embodiment which is compatible with the preceding embodiments, but only optional:

the production method further comprises, after the step of forming the core and before the step of depositing by epitaxy of the shell, an annealing step, said annealing being done at a temperature $T_{annealing}$, such that $T_{annealing} \leq 1.1*T_{shell\ epitaxy}$ and preferably $T_{annealing} \leq T_{shell\ epitaxy}$.

This annealing intended to eliminate a residual carbon, fluorine and oxygen contamination before the epitaxy of the shell, is advantageously brought to a "low temperature" so as to preserve the core of an alteration of the free surfaces thereof.

the annealing step is carried out preferably under hydrogen ($H_2$).

Alternatively, the annealing step is carried out under neutral gas, for example under nitrogen ($N_2$), under argon (Ar) or under helium (He).

the annealing step is carried out at a pressure of between 10 Torr and 100 Torr, and preferably substantially equal to 20 Torr.

According to a particularly advantageous embodiment and which is compatible with the preceding embodiments:

$T_{encapsulation\ epitaxy} \geq 830°$ C. and preferably $T_{encapsulation\ epitaxy} \geq 850°$ C.

Such a depositing temperature of the encapsulation layer makes it possible for increased growth speeds (>100 nm·min$^{-1}$) which are compatible with an industrial production method.

the deposition temperature of the encapsulation layer $T_{encapsulation\ epitaxy}$ is less than the melting temperature of the core.

$t_{Ge\ shell} \approx t_{Ge\ encapsulation}$.

The cladding can thus have a composition homogeneity.

$t_{Ge\ encapsulation} \leq 0.8 t_{Ge\ core}$ and preferably $t_{Ge\ encapsulation} \leq 0.5 t_{Ge\ core}$.

The optical index contrast between the core and the cladding can thus be sufficiently high to confine, by and large, the light flux in the core of the waveguide.

the method comprises a step of increasing the temperature between the step of depositing by epitaxy of the shell and the step of depositing the encapsulation layer, said temperature increasing step being carried out preferably under hydrogen ($H_2$), at a speed of around 2.5° C./s. Alternatively, this temperature increasing step is carried out under neutral gas, for example under nitrogen ($N_2$), under argon (Ar) or under helium (He).

Such a speed makes it possible to best control a temperature increasing ramp so as to not significantly exceed the target temperature $T_{encapsulation\ epitaxy}$.

the method comprises at least one short thermal cycling step after the deposition of the germanium (Ge)-based layer on the substrate, said thermal cycling being done at temperatures of between 750° C. and 890° C., preferably under $H_2$.

A short thermal cycling makes it possible to advantageously reduce a dislocation density present within the germanium-based layer.

the cladding is fully formed by the shell, by the encapsulation layer and by the layer on which the core rests (the substrate, for example). The shell surrounds all the faces of the core which are not in contact with or facing the substrate. The encapsulation layer surrounds all the faces of the shell which are not in contact with or facing the substrate.

the shell is directly in contact with the core.

the encapsulation layer is directly in contact with the shell.

the core has a main extension dimension D, such that D≥2 μm, according to a cross-section perpendicular to a main propagation direction of a light flux propagating within said core.

It is specified that, in the scope of the present invention, the deposition of a first layer on a second layer, does not compulsorily mean that the two layers are directly in contact with one another, but means that the first layer at least partially covers the second layer by being, either directly in contact with it, or by being separated from it by at least one other layer or at least one other element.

A substrate, a film, a layer, "with a basis" of a material A, means a substrate, a film, a layer comprising this material A only or this material A and possible other materials, for example alloy elements, elements with impurities or doping elements. Thus, a layer made of a germanium (Ge)-based material, can for example be a germanium (Ge) layer or a silicon-germanium (SiGe) layer.

In particular, germanium layer or layer made of germanium means, a layer comprising, by and large, germanium, and having preferably a germanium content greater than 95%.

In the present patent application, the thickness is taken along a direction perpendicular to the main faces of the substrate on which rests the different layers. In the figures, the thickness is taken along the vertical. In particular, in the present invention, the height of the core is substantially equal to the thickness of the layer from which is formed said core.

Main extension dimension means a characteristic dimension. In the present invention, if the core has a rectangular cross-section, the main extension dimension D corresponds to the length of the longest side of this rectangular cross-section. If the core has a square cross-section, the main extension dimension D corresponds to the length of the sides of the square. If the core has a circular cross-section, the main extension dimension D corresponds to the diameter.

In the scope of the present invention, the terms "concentration" and "content" are used equally. "Content" is used in a case or in an element, the molar fraction thereof or the atomic fraction thereof in a sample.

It will be noted here, in particular, that the germanium contents mentioned for SiGe alloys are expressed in % at. These atomic percentages can be measured using the following well-known methods such that:

EDX or X-EDS, the acronym for "energy dispersive x-ray spectroscopy" which means "X photon energy dispersive analysis".

This method is suitable for analyzing the composition of small devices such that waveguides comprising a core and a cladding formed of several layers of which a layer called a thin shell. It can be implemented on metal cuts within a Scanning Electron Microscope (SEM) or on the thin slides within a Transmission Electron Microscope (TEM).

SIMS, the acronym for "Secondary Ion Mass Spectroscopy".

This method makes it possible to access the basic composition of the layers. A zone of the sample is sprayed by primary ions causing a secondary ionization characteristic of the sprayed elements, and which can be quantified to via a mass spectrometer. In particular, for a waveguide produced from a method according to the invention, this method could highlight an interfacial contamination peak made of C, O and F between the core and the cladding. This method could also highlight a jump in Ge concentration within the cladding, between an SiGe shell and an SiGe encapsulation layer surrounding this shell. This jump is characterized, for example, by a difference in Ge concentration of at least 5% and preferably of at least 10% and preferably of at least 20%.

Figure 4:
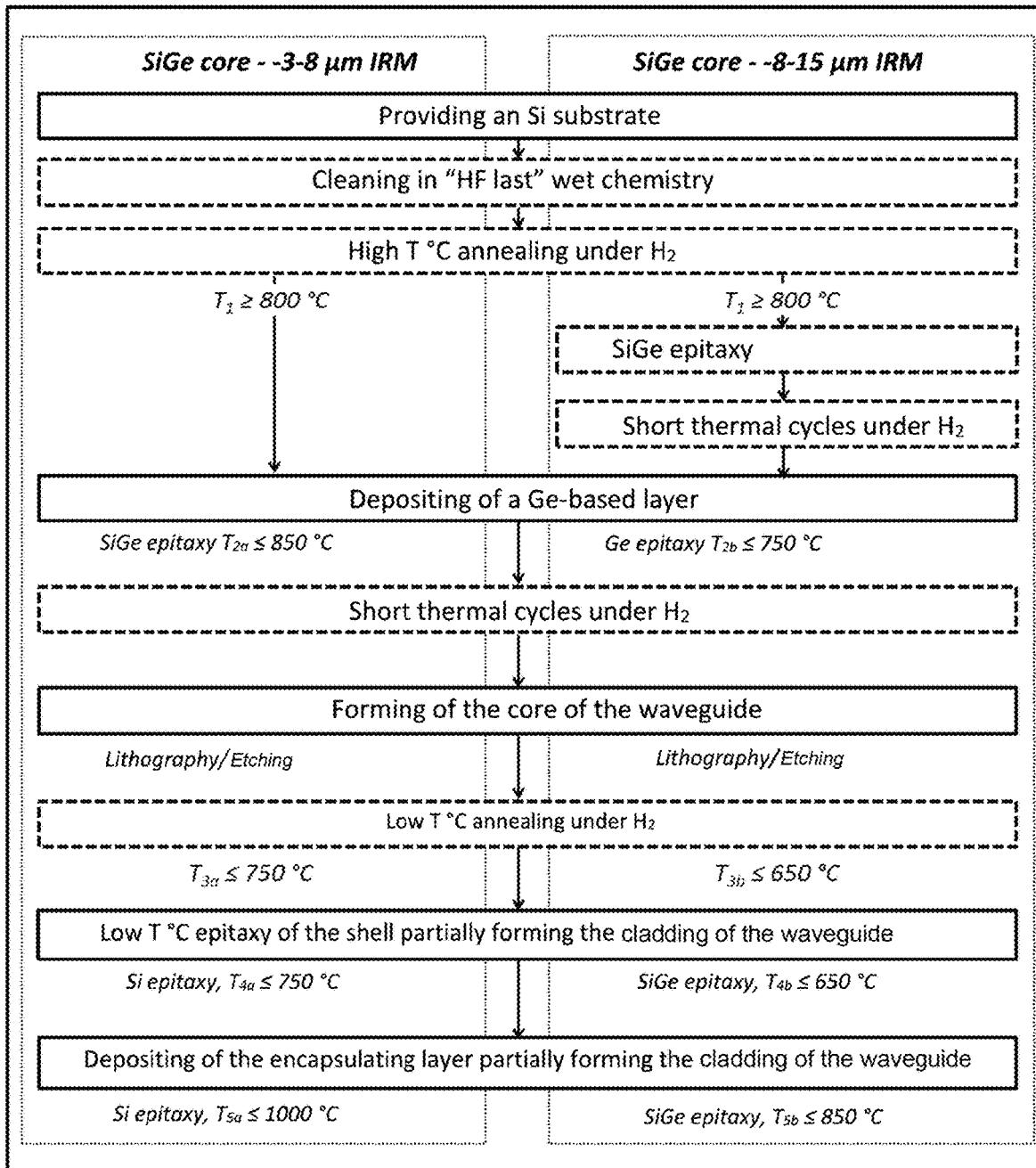
FIG. 4 show a diagram of a method illustrating examples of methods for producing a waveguide according to a first embodiment and a second embodiment of the invention.
Figure 5A:
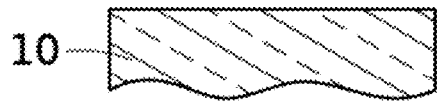
FIGS. 5a to 5e illustrate different steps of a method for producing a waveguide according to a first embodiment of the invention.
Figure 5D:
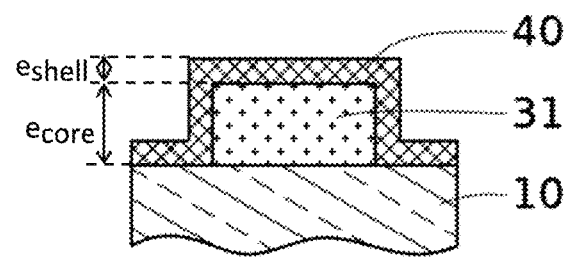
Figure 5B:
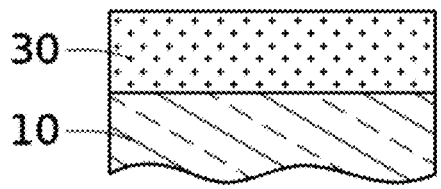
Figure 5E:
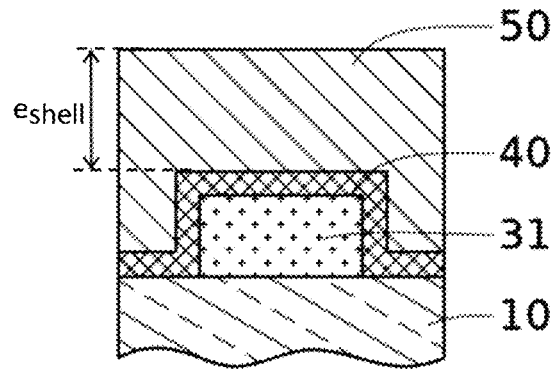
Figure 5C:
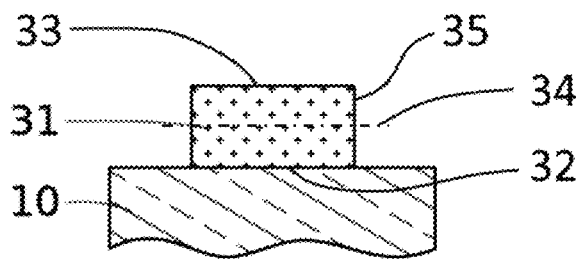
Figure 6A:
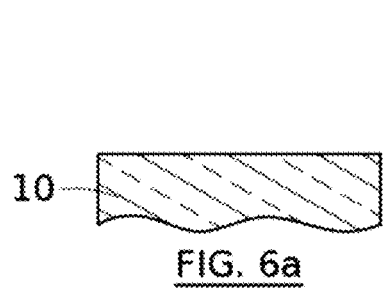
FIGS. 6a to 6f illustrate different steps of a method for producing a waveguide according to a second embodiment of the invention.
Figure 6D:
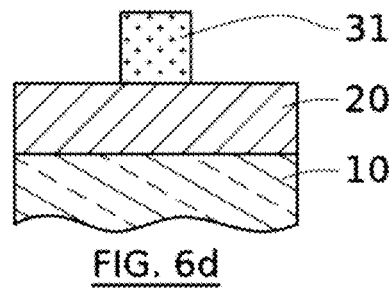
Figure 6B:
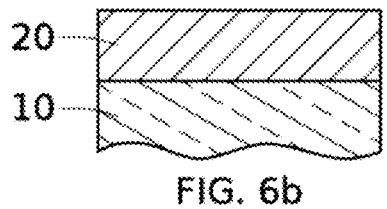
Figure 6E:
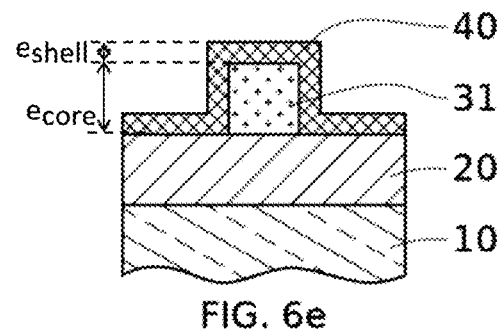
Figure 6C:
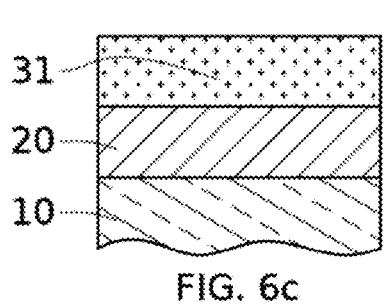
Figure 6F:
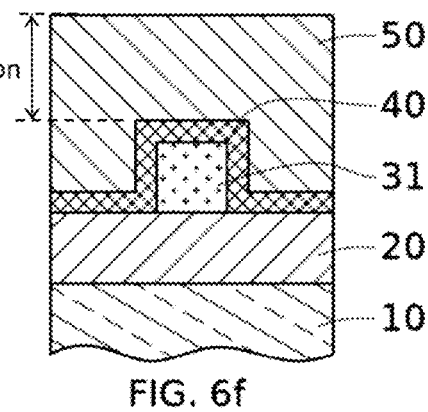

In reference to FIG. 4, the production method 100 according to the invention comprises a series of generic steps 110, 210, 310, 410, 510 intended to implement successively to produce a waveguide configured to guide a light flux belonging to the infrared medium spectrum.

In this example, the propagation direction of the light flux is perpendicular to the cross-section of the core illustrated in FIGS. 5c-5e and 6d-6f.

A first step consists of providing 110 a substrate.

This substrate is preferably a silicon (Si) substrate, of diameter 200 mm or 300 mm. This substrate can be alternatively an SOI (Silicon On Insulator) substrate.

Preferably, this substrate is prepared in view of later depositing steps 210, 120 by epitaxy of germanium-based layers.

Preparation steps, such as a cleaning step 111 followed by an annealing step 112 are preferably implemented on the substrate.

The cleaning step 111 preferably comprises an "HF last" type wet chemistry cleaning, with a basis of a hydrofluoric (HF) acid, so as to eliminate a native oxide layer on the substrate.

The annealing step 112 aims to eliminate a residual contamination in carbon, oxygen and fluorine elements resulting from the preceding cleaning step 111, so as to provide a substrate having a silicon surface suitable for depositing 210, 120 by epitaxy, also called growth by epitaxy or simply epitaxy, of germanium-based layers. This annealing step 112 is carried out at a temperature $T_1$ such that $800°$ C.$\leq T_1 \leq 1100°$ C. for a substrate Si in particular. Preferably, for an SOI substrate or for an Si substrate having an SiGe layer at the surface, this temperature will be lower, for example $800°$ C.$\leq T_1 \leq 900°$ C. This lower temperature makes it possible to reduce the risks of dewatering the upper Si layer of the SOI substrate, the appearance of slide lines due to inhomogeneities of temperature at the surface of the SOI plate or also a wave that is too strong from the SiGe surface. This annealing step 112 is preferably carried out under a hydrogen ($H_2$) stream at a pressure of around 20 Torr for around 2 minutes.

The method 100 comprises, following these steps of providing 110 the substrate, cleaning 111 and annealing 112, a depositing step 210 to form a germanium-based layer.

This depositing step 210 is preferably carried out by epitaxy, and the parameters of this depositing 210 in particular depend on the desired germanium content in said germanium-based layer.

A step of forming 310 the core of the waveguide is then carried out according to conventional lithography and engraving methods, from the germanium-based layer.

Advantageously, a step of depositing 410 by epitaxy of a shell on the core of the waveguide is carried out. This step of depositing 410 by epitaxy is carried out at a "low temperature", i.e. at a sufficiently low temperature to avoid a degradation of the core. This shell makes it possible, in particular to protect the core vis-à-vis the following step.

The following step comprises the deposition 510, preferably by epitaxy, of an encapsulation layer on the shell. This depositing 510 is done preferably at a temperature higher than the temperature to which the deposition 410 is done forming the shell.

The parameters of these different generic steps 110, 210, 310, 410, 510 can be adapted so as to disclaim different embodiments of the method 100.

Two embodiments, particularly advantageous but not limiting will now be described in detail.

A first embodiment of the method 100, illustrated by FIGS. 5a to 5e, relates to a method 100a for producing a waveguide comprising an SiGe core 31 and an Si cladding.

After providing 110, cleaning 111 and annealing 112 a silicon substrate 10, the step of depositing 210 the germanium-based layer 30 is configured such that said layer 30 has a thickness of 2 to 3 µm, and that is preferably composed of an SiGe alloy having a Ge content of between 20% and 50%.

This germanium-based layer 30 can has a substantially constant composition in the thickness thereof; alternatively at least one composition gradient can be made along the thickness of this layer 30. For example, the layer 30 can have a Ge content, varying in the thickness thereof according to a triangular profile. The layer 30 can have a minimum germanium content $t_{Ge}$ thereof of a few atomic percent, typically $t_{Ge} \leq 5\%$ at, at the level of an interface 32 with the Si substrate 10 and at the level of an upper face 33 opposite this interface 32, and a maximum germanium content $t_{Ge}$ of around 40% at the level of a median plane 34 situated between said interface 32 and said upper face 33.

The deposition 210 is preferably done by epitaxy from a chemistry based on dichlorosilane $SiH_2Cl_2$ and germane $GeH_4$ precursors, or on silane $SiH_4$ and germane $GeH_4$ precursors, in a gaseous phase, at a temperature $T_{2a}$ such that 850° C.$\leq T_{2a} \leq$ 900° C., and at a pressure of around 20 Torr.

This temperature $T_{2a}$ in particular makes it possible to benefit from increased growth speeds for this layer 30, which are compatible with a very thick depositing. Such a temperature $T_{2a}$ also makes it possible to distribute more evenly, the dislocations present within this layer 30 using a greater mobility of said dislocations, and to potentially minimize the density thereof by recombining/annihilating dislocations.

After depositing 210, a thermal cycling step 211 under $H_2$ at temperatures varying between 850° C. and 1000° C. over short cycles of a few minutes can advantageously make it possible to reduce the dislocation density emerging in the layer 30.

The step of forming 310 the core 31 is carried out from said layer 30 by standard photolithography and engraving methods.

In particular, a dry engraving method of deep reactive ionic type can be implemented in order to obtain vertical walls for the core 31 on a thickness of 2 to 3 µm.

This SiGe core 31 is preferably covered by a very thick silicon cladding, typically of between 6 µm and 12 µm, so as to produce an IRM waveguide configured to confine a light flux having a wavelength of between 3 µm and 8 µm.

Prior to the formation of this cladding, a second annealing 320 can be done at a temperature $T_{3a}$ substantially equal to 750° C., under a hydrogen ($H_2$) stream at a pressure of around 20 Torr for around 2 minutes.

This second annealing 320 makes it possible to at least partially eliminate a residual contamination coming from the preceding engraving step while avoiding altering the free surfaces of the core 31, and subsequently preserving a verticality of the walls and a, for example, rectangular cross-section of the core 31.

A thin silicon shell 40 is then advantageously formed on the core 31 during a step of depositing 410 by epitaxy.

This depositing 410 of the silicon shell 40 is preferably done at a temperature $T_{4a}$ substantially equal to 750° C. so as to avoid or limit a degradation of the free surfaces of the core 31.

This depositing 410 is done preferably by epitaxy from a chemistry based on a silane $SiH_4$, or dichlorosilane $SiH_2Cl_2$ precursor, in a gaseous phase at a pressure of between 10 Torr and 100 Torr, preferably substantially equal to 20 Torr. The silane $SiH_4$ chemistry has growth speeds higher than the dichlorosilane chemistry for this temperature $T_{4a}$ and can advantageously improve the yield of this depositing 410 of the Si shell 40.

The silicon shell 40 has a thickness of between 50 nm and 150 nm preferably, so as to advantageously protect the core 31 vis-à-vis the subsequent step of depositing 510 the silicon encapsulation layer 50.

This depositing step 510 is indeed carried out at a higher temperature, typically at a temperature $T_{5a}$ of between 850° C. and 1000° C., so as to increase the growth speed of the encapsulation layer 50 to deposit quicker a very thick material.

A chlorinated chemistry based on a dichlorosilane $SiH_2Cl_2$ precursor and an addition of hydrochloric HCl acid in a gaseous phase can advantageously make it possible to avoid a too-high soiling of the walls of the deposition chamber during this depositing step 510 aiming to form the encapsulation layer 50.

A temperature increase ramp of around 2.5° C./s under a hydrogen $H_2$ stream can advantageously make it possible to reach the temperature $T_{5a}$ from the temperature $T_{4a}$ with a sufficiently fine control to not excessively exceed said temperature $T_{5a}$.

The encapsulation layer 50, the shell 40 and the substrate 10 thus form the silicon cladding surrounding the silicon-germanium core 31 of the IRM waveguide. Preferably, the shell 40 surrounds all the faces of the core 31 which are not in contact with or facing the substrate 10. In this example, the shell 40 thus covers the flanks 35 and the whole upper face 33 of the core 31. Likewise, the encapsulation layer 50 surrounds all the faces of the shell 40 which are not in contact with or facing the core 31.

A temperature $T_{5a} \leq 1000°$ C. further makes it possible to limit an interdiffusion of the Si and Ge elements between the SiGe core 31 and the Si shell 40. A too-high interdiffusion of these elements can indeed damage the correct optical index contrast and consequently the correct confining of an optical mode of a light flux within such a waveguide.

A second embodiment of the method 100, illustrated by FIGS. 6a to 6f, relates to a method 100b for producing a waveguide comprising a Ge core 31 and a SiGe cladding. 10o Only the characteristics separate from the first embodiment are described below, the other characteristics not described being considered as identical to those of the first embodiment described in reference to FIGS. 5a to 5e.

Optionally, an epitaxy 120 of a buffer layer 20 is done prior to the step of depositing 210 the germanium-based layer 30. This buffer layer 20 is preferably an SiGe alloy having a Ge content of between 20% and 40% and a thickness greater than or equal to 6 µm.

This prior epitaxy 120 can be done at a temperature of between 850° C. and 900° C., from a chemistry $SiH_2Cl_2$ and $GeH_4$ for example.

A consecutive thermal cycling step 121 under $H_2$ at temperatures varying between 750° C. and 890° C. over short cycles of a few minutes can advantageously make it possible to reduce the dislocation density emerging in the buffer layer 20.

The step of depositing 210 the germanium-based layer 30 is subsequently configured such that this layer 30 has a thickness of 2 to 3 µm, and is preferably composed of Ge, preferably of at least 90% Ge and preferably of 100% Ge. This layer 30 can have impurities, for example Si, in low contents, typically of between a few tenths of atomic percent and a few atomic percent.

This depositing 210 of the layer 30 is preferably done by epitaxy from a chemistry based on a germane $GeH_4$ precursor in a gaseous phase, for example at a temperature $T_{2b}$ of around 400° C. and at a pressure of around 100 Torr for a duration of between 6 minutes and 10 minutes, then at the temperature $T_{2b}$ of around 750° C. and at a pressure of around 20 Torr for a duration of between 35 minutes and 55 minutes.

The step of forming 310 the core 31 is done from said germanium (Ge) layer 30 by standard photolithography and engraving methods.

This Ge core 31 is preferably covered by a very thick SiGe cladding, typically of between 6 µm and 12 µm, so as to produce an IRM waveguide configured to confine a light flux having a wavelength of between 8 µm and 15 µm.

Prior to forming this cladding, the second annealing 320 can be done at a temperature $T_{3b}$ substantially equal to 650° C., under hydrogen ($H_2$) stream at a pressure of around 20 Torr for around 2 minutes.

This second annealing 320 makes it possible to at least partially eliminate a residual contamination coming from the preceding step, while avoiding altering the free surfaces of the Ge core 31, subsequently preserving a verticality of the wall and a, for example, rectangular cross-section of said Ge core 31.

A thin silicon-germanium shell 40 is then advantageously formed on the Ge core 31 during a step of depositing 410 by epitaxy.

This depositing 410 of the SiGe shell 40 is preferably done at a temperature $T_{4b}$ substantially equal to 650° C., or of between 550° C. and 650° C., so as to avoid or limit a degradation of the free surfaces of the Ge core 31.

This depositing 410 is done preferably by epitaxy from a chemistry based on dichlorosilane $SiH_2Cl_2$ and germane $GeH_4$ precursors, or on silane $SiH_4$ and germane $GeH_4$ precursors, in a gaseous phase at a pressure of between 10 Torr and 100 Torr, preferably substantially equal to 20 Torr.

The silicon-germanium shell 40 has a thickness of between 100 nm and 500 nm so as to protect the Ge core 31 vis-à-vis the step of depositing 510 a silicon-germanium encapsulation layer 50.

This step of depositing 510 the encapsulation layer 50 is indeed carried out at a higher temperature, typically at a temperature $T_{5b}$ less than or equal to 850° C., so as to increase the growth speed of the encapsulation layer 50 to deposit quicker a very thick material.

The encapsulation layer 50, the shell 40 and preferably the buffer layer 20 thus form the SiGe cladding surrounding the Ge core 31 of the IRM waveguide.

In view of the preceding description, it clearly appears that the invention to proposes a particularly reliable and effective method for producing, with an industrial yield, waveguides of which the performances are not altered.

The invention is not limited to the embodiments described above and extends to all embodiments covered by the claims.

The invention claimed is:

1. A method for producing a waveguide comprising at least one core and a cladding, the method comprising at least the following steps:
providing a substrate;
depositing a germanium-based (Ge-based) layer on the substrate;
forming the at least one core of the waveguide in the Ge-based layer;
depositing an encapsulation layer around the at least one core, the encapsulation layer having a germanium content, $t_{GE\ encapsulation}$, such that: $t_{GE\ encapsulation} \leq 0.9$ $t_{GE\ core}$, where $t_{Ge\ core}$ is a germanium content of the at least one core, so as to at least partially form the cladding; and
before the step of depositing the encapsulation layer, depositing by epitaxy a shell around the at least one core, the shell at least partially forming the cladding and having a germanium content, $t_{Ge\ shell}$, such that: $t_{Ge\ shell} \leq 0.9$ $t_{Ge\ core}$, where the depositing by epitaxy is performed at a temperature $T_{shell\ epitaxy} \leq 780°$ C.,
wherein the encapsulation layer is deposited by epitaxy at a temperature, $T_{encapsulation\ epitaxy}$, such that: $T_{encapsulation\ epitaxy} \geq 1.08 * T_{shell\ epitaxy}$, and
wherein $t_{Ge\ shell} \approx t_{Ge\ encapsulation}$.

2. The method for producing a waveguide according to claim 1, wherein $T_{encapsulation\ epitaxy} \geq 830°$ C. or $T_{encapsulation\ epitaxy} \geq 850°$ C.

3. The method for producing a waveguide according to claim 1, further comprising, after the step of forming the at least one core and before the step of depositing the shell by epitaxy, a step of annealing at a temperature, $T_{annealing}$, such that $T_{annealing} \leq 1.1 * T_{shell\ epitaxy}$ or $T_{annealing} \leq T_{shell\ epitaxy}$.

4. The method for producing a waveguide according to claim 3, wherein the step of annealing is performed under a neutral gas.

5. The method for producing a waveguide according to claim 1, wherein the at least one core has a main extension dimension, D, such that D≥2 µm, according to a cross-section perpendicular to a main propagation direction for a light flux propagating within the at least one core.

6. The method for producing a waveguide according to claim 1, wherein the Ge-based layer is a silicon-germanium (SiGe) layer.

7. The method for producing a waveguide according to claim 6, wherein the Ge-based layer has a thickness, $e_{core}$, of between 1 µm and 4 µm, and the thickness, $e_{core}$, being determined along a direction perpendicular to a main plane in which the substrate extends.

8. The method for producing a waveguide according to claim 6, wherein the Ge-based layer has a substantially constant germanium content along a thickness, $e_{core}$, the germanium content being between 20% and 50%.

9. The method for producing a waveguide according to claim 6, wherein the encapsulation layer and the shell are made of silicon (Si).

10. The method for producing a waveguide according to claim 6, wherein the shell has a thickness, $e_{shell}$, of between 50 nm and 100 nm, the thickness, $e_{shell}$, being determined at a right of the core and along a direction perpendicular to a main plane in which the substrate extends.

11. The method for producing a waveguide according to claim 6, wherein $T_{shell\ epitaxy} \leq 750°$ C. and wherein $T_{encapsulation\ epitaxy} \leq 1000°$ C.

12. The method for producing a waveguide according to claim 1, wherein the Ge-based layer has a varying germanium content along a direction perpendicular to a main plane in which the substrate extends, according to a concentration profile having a maximum germanium content of between 30% and 50%, and a minimum germanium content of between 0% and 5%.

13. The method for producing a waveguide according to claim 12, wherein the concentration profile is triangular.

14. The method for producing a waveguide according to claim 1, wherein the Ge-based layer has a Ge content that is greater than 50% or is greater than 95%.

15. The method for producing a waveguide according to claim 14, further comprising, before the step of depositing the Ge-based layer, at least a step of depositing at least one buffer layer made of silicon-germanium (SiGe) having a germanium content of between 20% and 40%.

16. The method for producing a waveguide according to claim 14, wherein the encapsulation layer and the shell are made of silicon-germanium (SiGe), a germanium content in the shell and the encapsulation layer being between 20% and 40%.

17. The method for producing a waveguide according to claim 16, wherein the shell has a thickness, $e_{shell}$, of between 100 nm and 500 nm.

18. The method for producing a waveguide according to claim 14, wherein $T_{shell\ epitaxy} \leq 650°$ C.

19. The method for producing a waveguide according to claim 14, wherein $T_{encapsulation\ epitaxy} \leq 850°$ C.

20. The method for producing a waveguide according to claim 1, wherein $t_{Ge\ encapsulation} \leq 0.8\ t_{Ge\ core}$.

21. The method for producing a waveguide according to claim 1, wherein $t_{Ge\ encapsulation} \leq 0.5\ t_{Ge\ core}$.

22. The method for producing a waveguide according to claim 1, comprising forming the shell from silicon-germanium with a germanium content between 20% and 40%.

23. The method for producing a waveguide according to claim 1, wherein:
the Ge-based layer comprises SiGe,
the encapsulation layer comprises Si; and
the shell comprises Si.

24. A method for producing a waveguide comprising at least one core and a cladding, the method comprising at least the following steps:
providing a substrate;
depositing a silicon-germanium-based (SiGe-based) layer on the substrate;
forming the at least one core of the waveguide in the SiGe-based layer;
depositing a silicon encapsulation layer around the at least one core, the encapsulation layer having a zero germanium content, so as to at least partially form the cladding; and
before the step of depositing the encapsulation layer, depositing by epitaxy a silicon shell around the at least one core, the shell at least partially forming the cladding and having a zero germanium content, where the depositing by epitaxy is performed at a temperature $T_{shell\ epitaxy} \leq 780°$ C.,
wherein the encapsulation layer is deposited by epitaxy at a temperature, $T_{encapsulation\ epitaxy}$, such that: $T_{encapsulation\ epitaxy} \geq 1.08 * T_{shell\ epitaxy}$.

* * * * *